United States Patent [19]

Akiyama

[11] Patent Number: 5,145,405
[45] Date of Patent: Sep. 8, 1992

[54] CHIP CONNECTOR STRUCTURE

[75] Inventor: Koichi Akiyama, Tokyo, Japan

[73] Assignee: Hirose Electric Co., Ltd., Tokyo, Japan

[21] Appl. No.: 666,613

[22] Filed: Mar. 8, 1991

[30] Foreign Application Priority Data

May 15, 1990 [JP] Japan .............................. 2-49882[U]

[51] Int. Cl.⁵ .............................................. B65D 73/02
[52] U.S. Cl. ................................. 439/525; 206/328; 206/334; 221/197; 221/287
[58] Field of Search ................ 221/197, 287; 206/328, 206/334; 198/795; 439/70–73, 525, 526, 476, 483, 484, 569, 571, 527

[56] References Cited

U.S. PATENT DOCUMENTS 4,552,267 11/1985 Layher .................................. 206/334
4,954,088 9/1990 Fujizaki et al. ........................ 439/83

FOREIGN PATENT DOCUMENTS 37386 2/1989 Japan .................................. 206/328

Primary Examiner—Gary F. Paumen
Attorney, Agent, or Firm—Kanesaka & Takeuchi

[57] ABSTRACT

A chip structure (connector) (20) includes a socket body (21); and a pair of L-shaped reinforcing brackets (23, 24), with a vertical leg (25) attached to either side of the socket body and a horizontal leg (28) provided with an abutment face (29).

1 Claim, 6 Drawing Sheets

CHIP CONNECTOR STRUCTURE

BACKGROUND OF THE INVENTION

1. Field of the Invention

The present invention relates to chip structures, such as chip sockets and plugs, housed within a stick which is to be mounted on a stick feeder.

2. Description of the Prior Art

Chip mounting machines are used to mount chip structures (connectors), such as clip sockets and plugs, on boards. The chip mounting machines include stick feeders. The stick feeders feed a number of sticks each housing a number of chip structures, such as chip sockets or plugs, to the next process station.

FIGS. 9-12 show two types of conventional chip structures; a chip socket 1 and a 14 chip plug 2.

In FIGS. 9 and 10, the chip socket 1 includes a socket body 3 which has a pair of positioning projections 4 extending downwardly from the bottom surface 3a and a pair of L-shaped reinforcing brackets 5 and 6 on opposite sides. Each reinforcing bracket 5 or 6 has an engagement hole 8 on the vertical leg 7 for engagement with an engaging projection 9 of the socket body 3, thereby attaching the reinforcing bracket 5 or 6 to the socket body 3. The horizontal leg 10 of the reinforcing bracket 5 or 6 is parallel to the bottom surface 3a.

Similarly, as FIGS. 11 and 12 show, the chip plug 2 includes a plug body 11 which has a pair of positioning projections 4 and a pair of reinforcing brackets 5 and 6.

As FIG. 13 shows, a number of chip structures 12, such as chip sockets 1 or chip plugs 2, are aligned in a line within a stick 13 such that the edges 10a of the adjacent horizontal legs 10 are brought into contact with each other.

As FIG. 8 shows, the stick 34 is obliquely mounted on a stick feeder 14 for feeding the chips 12 one by one from the lowest one without breaking the contact between the adjacent horizontal legs 10.

As FIG. 14 shows, however, the adjacent horizontal legs 10 can overlap because of vibrations, etc., making the assembling robot fail to accurately position the chips 12 on the board.

SUMMARY OF THE INVENTION

Accordingly, it is an object of the invention to provide a chip structure which enables an assembling robot to accurately position it on a board.

According to the invention there is provided a chip structure which includes a structure body; and a pair of L-shaped reinforcing brackets, with a vertical leg attached to either side of said structure body and a horizontal leg provided with an abutment face.

The chip structure slides down within a stick which is obliquely mounted on a stick feeder, with the adjacent abutment faces abutting on each other so that the adjacent horizontal legs of the chip structure do not overlap because of vibrations, etc.

The other objects, features, and advantages of the invention will be more apparent from the following description when taken in conjunction with the accompanying drawings.

DESCRIPTION OF THE PREFERRED EMBODIMENT

Figure 1:
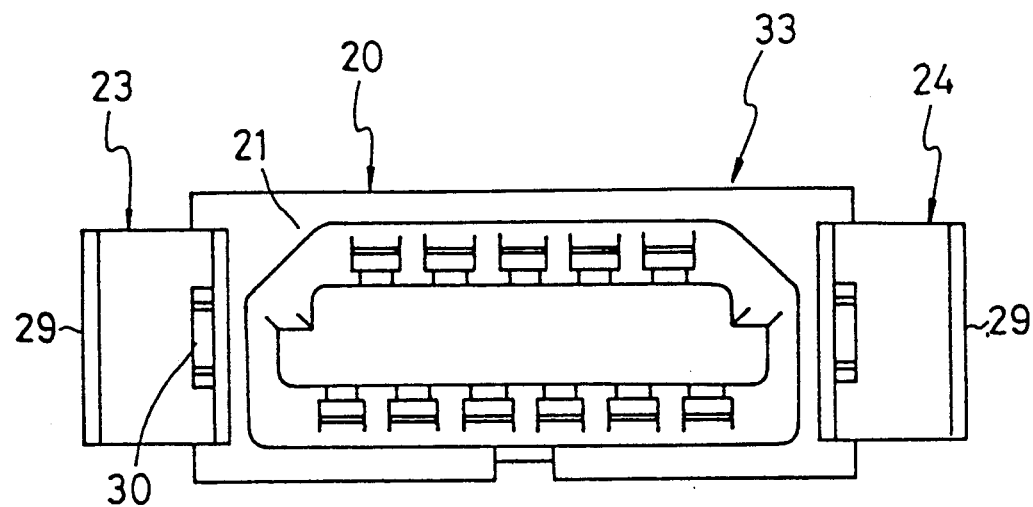
FIG. 1 is a top plan view of a chip sockets according to an embodiment of the invention.
Figure 2:
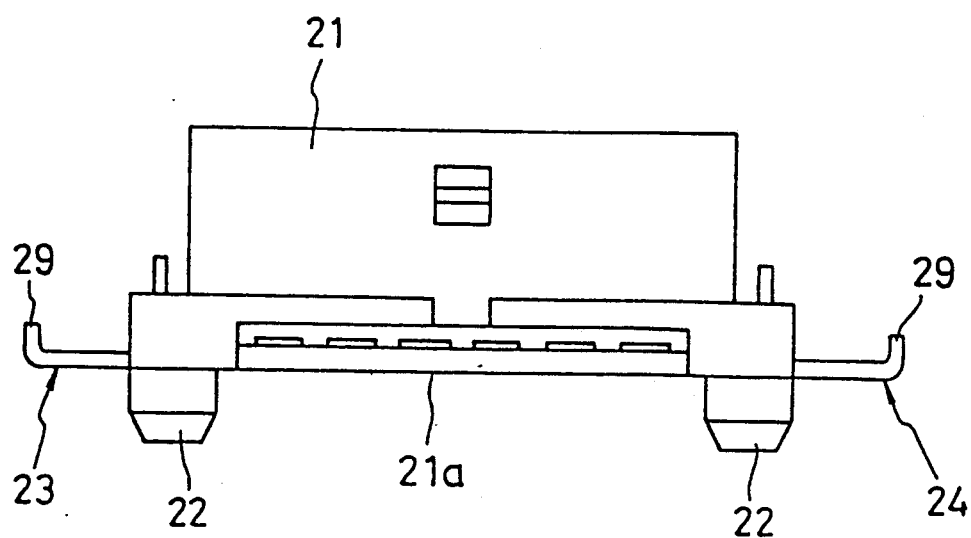
FIG. 2 is a side elevational view of the chip sockets of FIG. 1.
Figure 3:
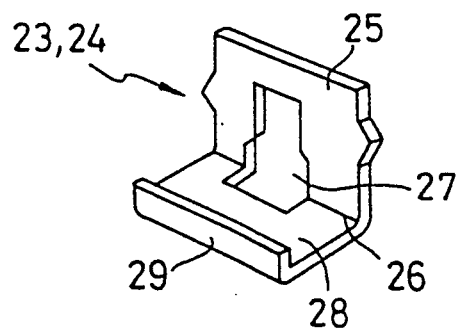
FIG. 3 is a perspective view of a reinforcing bracket useful for the chip sockets of FIG. 1.

In FIGS. 1 and 2, a chip socket 20 includes a socket body 21 which has a pair of positioning projections 22 extending downwardly from he bottom surface 21a and a pair of reinforcing brackets 23 and 24 on opposite sides. As FIG. 3 shows, each bracket 23 or 24 is made by bending a plate at the middle by 90 degrees and providing on a vertical leg 25 an engagement hole 27 which extends upwardly from the bending portion 26 and bending the front end of the horizontal leg 28 upwardly at right angles, forming a abutment face 29. A pair of engagement projections 30 are provided on opposite sides of the socket body 21 for engagement with the engagement holes 27 of the brackets 23 and 24, thereby attaching the brackets 23 and 24 to the socket body 21. The horizontal legs 28 of the brackets 23 and 24 are parallel to the bottom surface 21a and perpendicular to the abutment faces 29.

Figure 4:
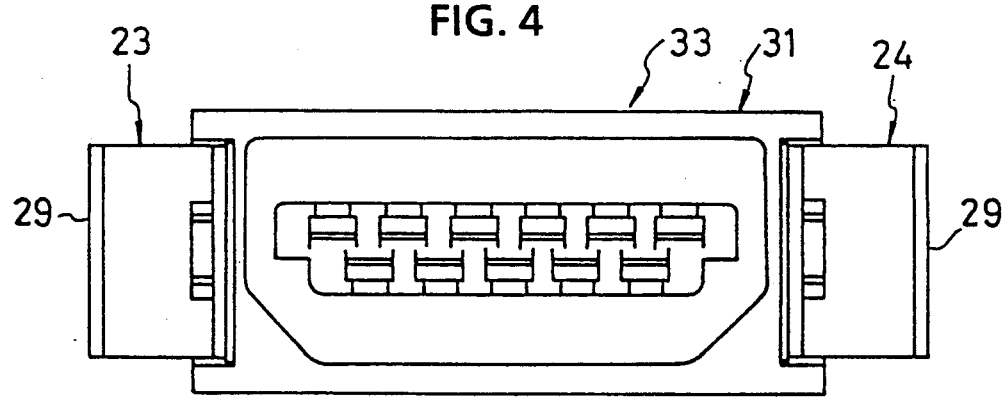
FIG. 4 is a top plan view of a chip plug according to an embodiment of the invention.
Figure 5:
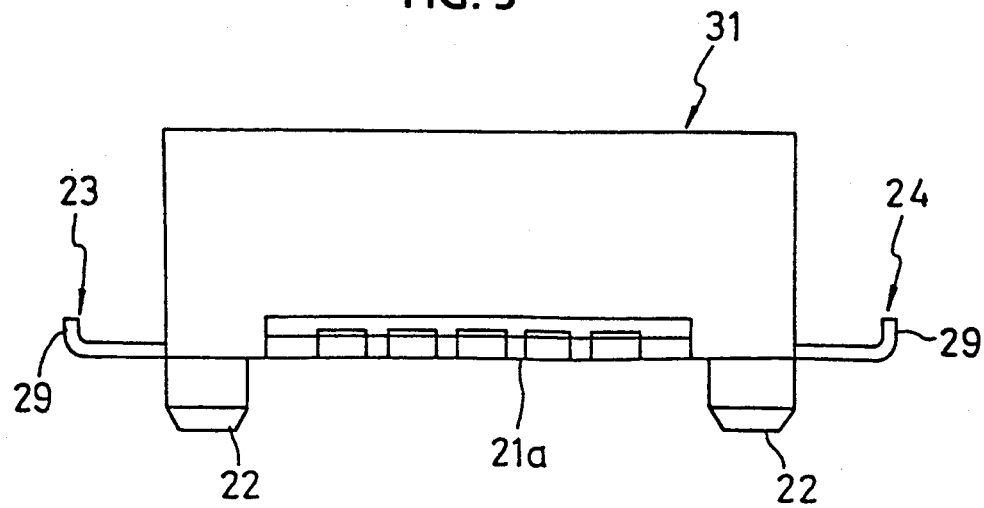
FIG. 5 is a side elevational view of the chip plug of FIG. 4.

Similarly, as FIGS. 4 and 5 show, the chip plug 31 has a pair of positioning projects 22 and a pair of reinforcing brackets 23 and 24.

Figure 6:
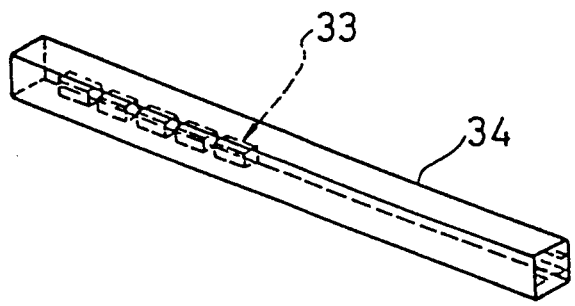
FIG. 6 is a perspective view of a stick which houses a number of chip structure according to the invention.
Figure 7:
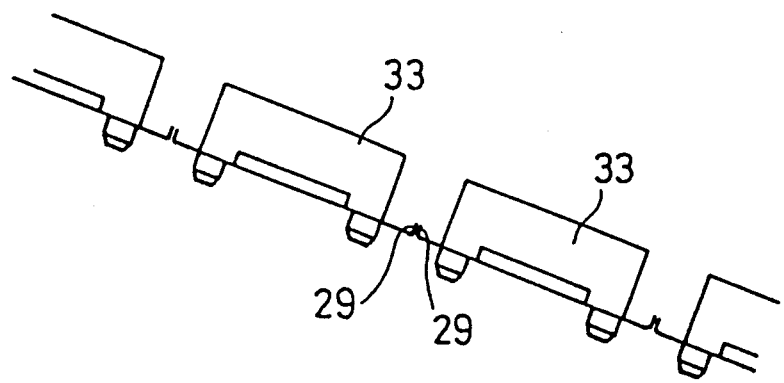
FIG. 7 is a schematic diagram showing a series of chip structures in contact with each other.

As FIGS. 6 and 7 show, a number of chip sockets or plugs 33 are aligned in a line within a stick 34 such that the abutment faces 29 of the adjacent chip structures 33 are brought into contact with each other.

Figure 8:
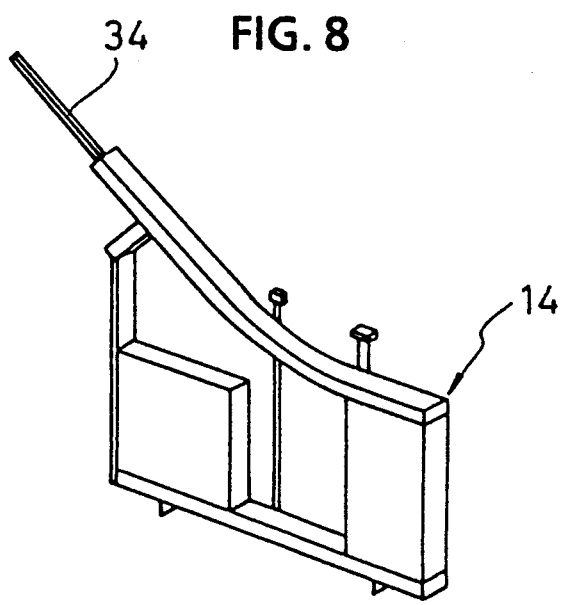
FIG. 8 is a perspective view of a stick feeder.
Figure 9:
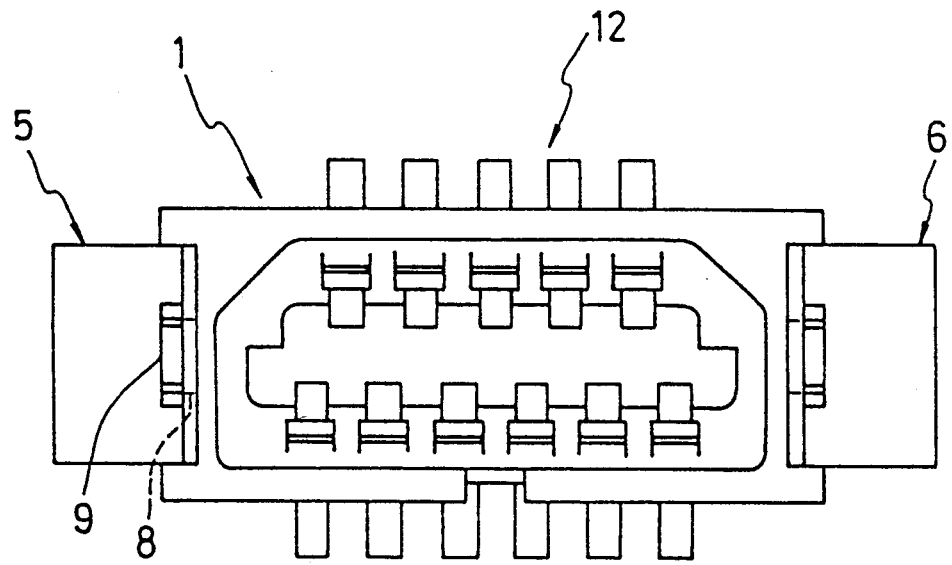
FIG. 9 is a top plan view of a conventional chip socket.
Figure 10:
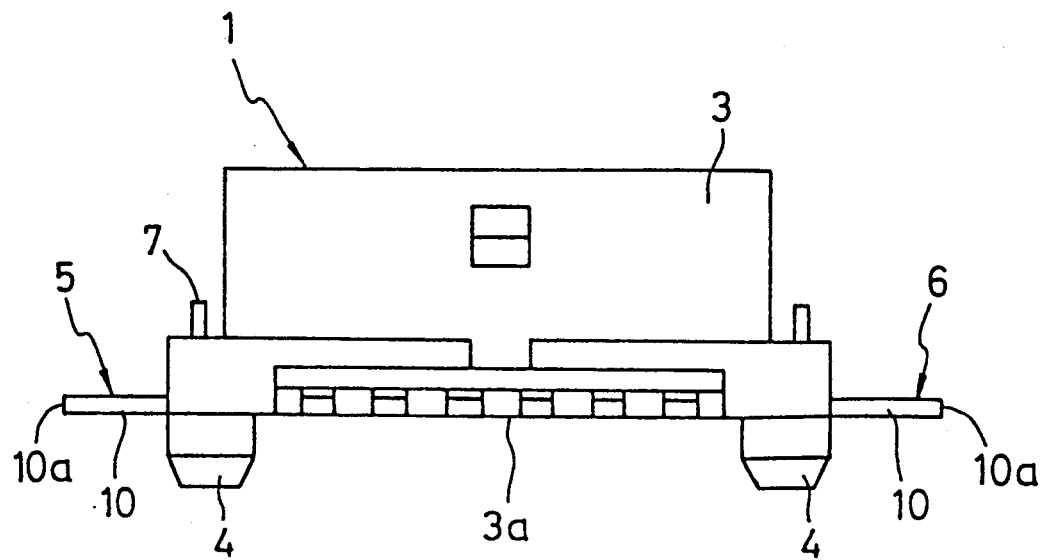
FIG. 10 is a side elevational view of the conventional chip socket of FIG. 9.
Figure 11:
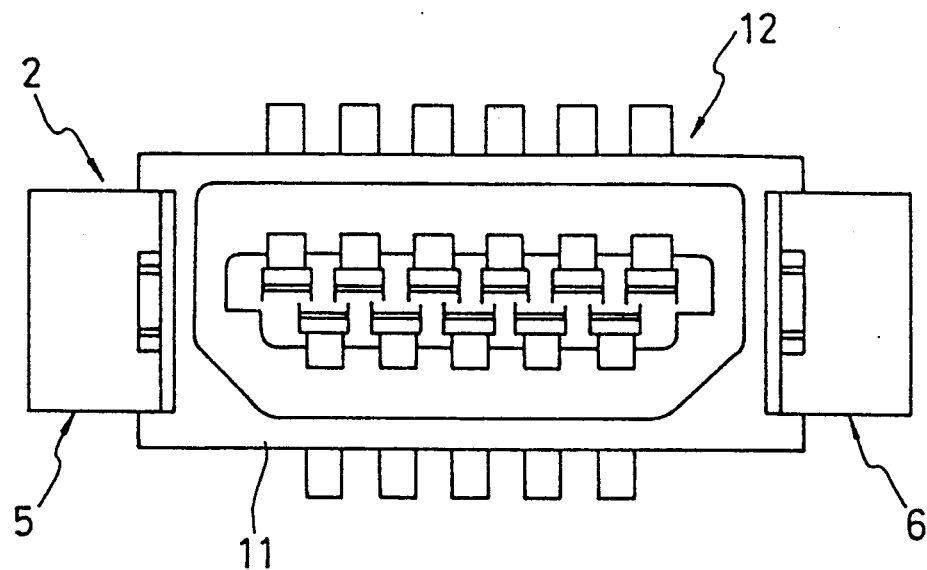
FIG. 11 is a top plan view of a conventional chip plug.
Figure 12:
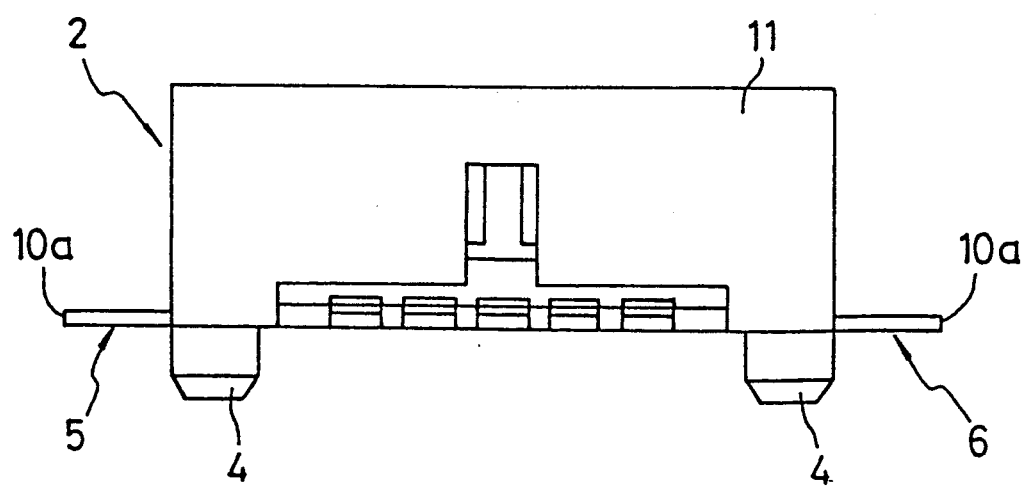
FIG. 12 is a side elevational view of a conventional chip plug of FIG. 11.
Figure 13:
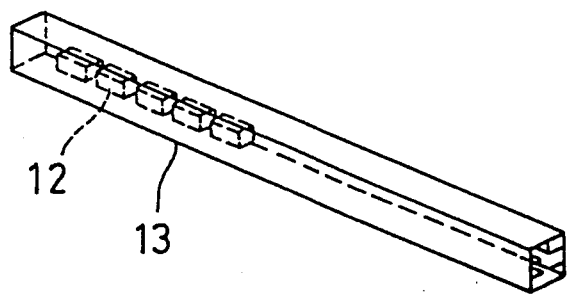
FIG. 13 is a perspective view of a stick which houses a number of the conventional chip structures.
Figure 14:
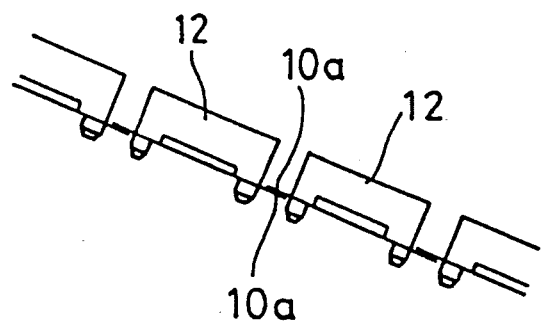
FIG. 14 is a schematic diagram showing a series of the conventional chip structures with their reinforcing legs overlapping.

As FIG. 8 shows, the stick 34 is obliquely mounted on the stick feeder 14 so that the chip structures 33 are fed one by one from the lowest one. The abutment faces 29 are so high that the horizontal legs 28 are prevented from overlapping the adjacent horizontal legs 28, thereby assuring accurate positioning of the chip structures 33 on the board by the assembling robot.

As has been described above, according to the invention, abutment faces are provided for the horizontal legs of reinforcing brackets for chip structures (connectors) so that the respective chip structures are moved in the stick with their abutment faces abutting on each other. As a result, the horizontal legs of the adjacent chip structures are prevented from overlapping because of vibrations, etc., thereby assuring accurate positioning of the chip structures on the board by the assembling robot.

I claim:

1. An electronic connector comprising:
   a connector body; and
   a pair of L-shaped reinforcing brackets, with a vertical leg attached to either side of said connector body and a horizontal leg provided with an abutment face, said horizontal leg extending in parallel to a major surface of said connector body; and
   said abutment face being made by bending a front portion of said horizontal leg upwardly in a direction perpendicular to said major surface and parallel to said vertical leg.

* * * * *